(12) United States Patent
Hwang et al.

(10) Patent No.: US 10,739,889 B2
(45) Date of Patent: Aug. 11, 2020

(54) TOUCH DISPLAY DEVICE AND TOUCH DISPLAY PANEL

(71) Applicant: LG Display Co., Ltd., Seoul (KR)

(72) Inventors: KwangJo Hwang, Paju-si (KR); SuChang An, Seoul (KR); Yangsik Lee, Paju-si (KR); DeukSu Lee, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/162,324

(22) Filed: Oct. 16, 2018

(65) Prior Publication Data

US 2019/0129548 A1    May 2, 2019

(30) Foreign Application Priority Data

Oct. 27, 2017 (KR) .................. 10-2017-0141565

(51) Int. Cl.
| | |
|---|---|
| *G06F 3/041* | (2006.01) |
| *G06F 3/044* | (2006.01) |
| *G06F 3/047* | (2006.01) |
| *H01L 27/32* | (2006.01) |
| *H01L 51/52* | (2006.01) |

(52) U.S. Cl.
CPC ............ *G06F 3/0412* (2013.01); *G06F 3/041* (2013.01); *G06F 3/044* (2013.01); *G06F 3/047* (2013.01); *G06F 3/0416* (2013.01); *H01L 27/3246* (2013.01); *H01L 27/3276* (2013.01); *H01L 51/5237* (2013.01); *G06F 2203/04112* (2013.01)

(58) Field of Classification Search
CPC ........... G06F 3/044; G06F 2203/04112; G06F 2203/04103; G06F 2203/04111; G06F 3/0446; G06F 3/047; G06F 3/04164; G06F 3/0445; G06F 2203/04107; G06F 3/0448; H01L 2251/5338; H01L 27/124; H01L 33/08

USPC ................ 345/173–175; 178/18.01–18.06
See application file for complete search history.

(56) References Cited

U.S. PATENT DOCUMENTS

| | | | | |
|---|---|---|---|---|
| 9,046,955 | B1* | 6/2015 | Lee | ................ G06F 3/0412 |
| 9,158,425 | B2* | 10/2015 | Peng | .................. G06F 3/045 |
| 10,042,465 | B2* | 8/2018 | Kang | .................. G06F 3/044 |
| 2012/0154308 | A1 | 6/2012 | Jeon et al. | |
| 2014/0117316 | A1* | 5/2014 | Choi | ............... H01L 27/3246 257/40 |
| 2015/0220204 | A1 | 8/2015 | Noguchi et al. | |
| 2015/0364117 | A1 | 12/2015 | Azumi et al. | |

(Continued)

FOREIGN PATENT DOCUMENTS

| | | |
|---|---|---|
| EP | 2650762 A2 | 10/2013 |
| EP | 2887185 A1 | 6/2015 |

(Continued)

OTHER PUBLICATIONS

Extended European Search Report, European Patent Application No. 18202132.9, dated Feb. 13, 2019, 14 pages.

*Primary Examiner* — Duc Q Dinh
(74) *Attorney, Agent, or Firm* — Fenwick & West LLP

(57) ABSTRACT

A touch display device and panel. In the display panel, an insulating film is provided on and in contact with an encapsulating layer, thereby reducing the entire thickness of the panel. The fabrication process of the touch display panel is simplified, thereby facilitating fabrication of the touch display device and panel.

22 Claims, 21 Drawing Sheets

(56) References Cited

U.S. PATENT DOCUMENTS

| | | | |
|---|---|---|---|
| 2015/0378486 A1 | 12/2015 | Yu et al. | |
| 2016/0103537 A1* | 4/2016 | Park | G06F 3/0412 345/174 |
| 2016/0202829 A1 | 7/2016 | Choi et al. | |
| 2016/0306472 A1 | 10/2016 | Park et al. | |
| 2017/0069692 A1 | 3/2017 | Lee et al. | |
| 2017/0090634 A1 | 3/2017 | Yang et al. | |
| 2018/0095584 A1* | 4/2018 | Lee | G06F 3/0416 |

FOREIGN PATENT DOCUMENTS

| | | |
|---|---|---|
| EP | 3187986 A1 | 7/2017 |
| KR | 10-2016-0017336 A | 2/2016 |

\* cited by examiner

TOUCH DISPLAY DEVICE AND TOUCH DISPLAY PANEL

CROSS-REFERENCE TO RELATED APPLICATION

This application claims priority to Republic of Korea Patent Application No. 10-2017-0141565, filed on Oct. 27, 2017, which is hereby incorporated by reference in its entirety.

BACKGROUND

Field of Disclosure

Exemplary embodiments of the present disclosure relate to a touch display device and panel.

Description of Related Art

In response to the development of the information society, demand for a variety of display devices for displaying images is increasing. In this regard, a range of display devices, such as liquid crystal display (LCD) devices, plasma display devices, and organic light-emitting diode (OLED) display devices, have recently come into widespread use.

Among such display devices, touch display devices provide touch-based user interfaces enabling users to intuitively and conveniently input data or instructions directly to devices, rather than using conventional data input systems, such as buttons, a keyboard, or a mouse.

To provide such touch-based user interfaces, touch display devices must be able to sense a touch performed by a user and accurately determine touch coordinates.

In this regard, among a variety of touch sensing methods, capacitance touch sensing is commonly used to sense a touch and to determine touch coordinates, based on a change in capacitance occurring on a plurality of touch electrodes.

In touch display devices of the related art, in the process of fabricating touch electrodes in a display panel, the touch electrodes are fabricated by depositing an insulating film after depositing a buffer layer in order to prevent damage to data lines or data link lines located in the periphery of the display panel.

In this case, the process may be more complicated, since the deposition of the buffer layer and the deposition of the insulating film are repeatedly performed.

In addition, since the buffer layer remaining in the structure of the display panel increases the overall thickness of the touch display panel, to which a variety of structures, such as touch electrodes, must be added, it may be difficult to fabricate a compact touch display panel.

Accordingly, improvements in the efficiency of display fabrication processing have been demanded.

SUMMARY

Various aspects of the present disclosure provide a touch display device and panel having a compact structure, by which the overall thickness can be reduced.

Also provided are a touch display device and panel having an improved data panel structure.

The objects of exemplary embodiments are not limited to the aforementioned description, and other objects not explicitly disclosed herein will be clearly understood by a person skilled in the art to which the present disclosure pertains from the description provided hereinafter.

Exemplary embodiments according to the present disclosure may provide a touch display device and panel, the overall thickness of which is reduced, due to an insulating film being located on and in contact with an encapsulating layer of the display panel.

Also provided are a touch display device and panel in which touch sensor metals are used in a data pad of the display panel.

According to exemplary embodiments, the touch display device and panel can be easily fabricated, due to the simplified fabrication process of the touch display panel.

According to exemplary embodiments, the overall panel thickness of the touch display device and panel can be reduced.

According to exemplary embodiments, in the touch display device and panel, touch sensor metals may be used in a data pad part and a touch pad part to protect data link lines while reducing the difference in height between the data pad part and the touch pad part.

In some exemplary embodiments, a touch display device comprises a display panel in which a plurality of data lines, a plurality of gate lines, a plurality of subpixels defined by the plurality of data lines and the plurality of gate lines, a plurality of touch electrodes, and a plurality of touch lines connected to the plurality of touch electrodes are disposed, a display driving circuit driving the plurality of data lines and the plurality of gate lines, a touch driving circuit driving the plurality of touch lines, wherein the plurality of touch electrodes and the plurality of touch lines comprise touch sensor metals, and wherein the display panel comprises an encapsulating layer protecting an organic light-emitting diode at each of the plurality of subpixels, the encapsulating layer extending to a peripheral area of the display panel, an insulating film at least a part of which is provided on the encapsulating layer AND extends to the peripheral area of the display panel, a plurality of data link lines connected to the plurality of data lines in the display panel, the plurality of data link lines extending from the display panel to the peripheral area of the display panel, data pads connected to the plurality of data link lines exposed through first contact-holes of the insulating film, the data pads connected to the display driving circuit, and touch pads connected to an electrode pattern of the plurality of touch electrodes in the display panel, the touch pads connected to the plurality of touch lines located on the insulating film in the peripheral area of the display panel.

In some exemplary embodiments, a touch display panel comprises a plurality of organic light-emitting diodes at a plurality of subpixels defined by a plurality of data lines and a plurality of gate lines, an encapsulating layer protecting the plurality of organic light-emitting diodes, an insulating film at least a part of which is located on and in contact with the encapsulating layer, a plurality of data link lines connected to the plurality of data lines in the touch display panel, the plurality of data link lines extending from the touch display panel to a peripheral area of the encapsulating layer, data pads connected to the plurality of data link lines exposed through first contact-holes of the insulating film, the data pads connected to a display driving circuit, and touch pads connected to an electrode pattern of touch electrodes in the touch display panel, the touch pads connected to the plurality of touch lines located on the insulating film in the peripheral area of the encapsulating layer.

In some exemplary embodiments, a touch display panel comprises a plurality of organic light-emitting diodes at a plurality of subpixels defined by a plurality of data lines and a plurality of gate lines, an encapsulating layer protecting the plurality of organic light-emitting diodes, the encapsulating layer extending to a peripheral area of the touch display panel, an insulating film located on and in contact with the encapsulating layer, wherein the insulating film extends to a data pad area in the peripheral area of the touch display panel.

In some exemplary embodiments, a touch display device comprises a display panel in which a plurality of data lines, a plurality of gate lines, a plurality of subpixels defined by the plurality of data lines and the plurality of gate lines, a plurality of touch electrodes comprising touch sensor metals, and a plurality of touch lines comprising touch sensor metals connected to the plurality of touch electrodes are disposed, a plurality of data link lines connected to the plurality of data lines in the display panel, the plurality of data link lines extending from the display panel to a peripheral area of the display panel, wherein a metal layer of a same material as touch sensor metals is disposed on the plurality of data link lines.

BRIEF DESCRIPTION

The above and other objects, features, and advantages of the present disclosure will be more clearly understood from the following detailed description when taken in conjunction with the accompanying drawings, in which.

DETAILED DESCRIPTION

Figure 1:
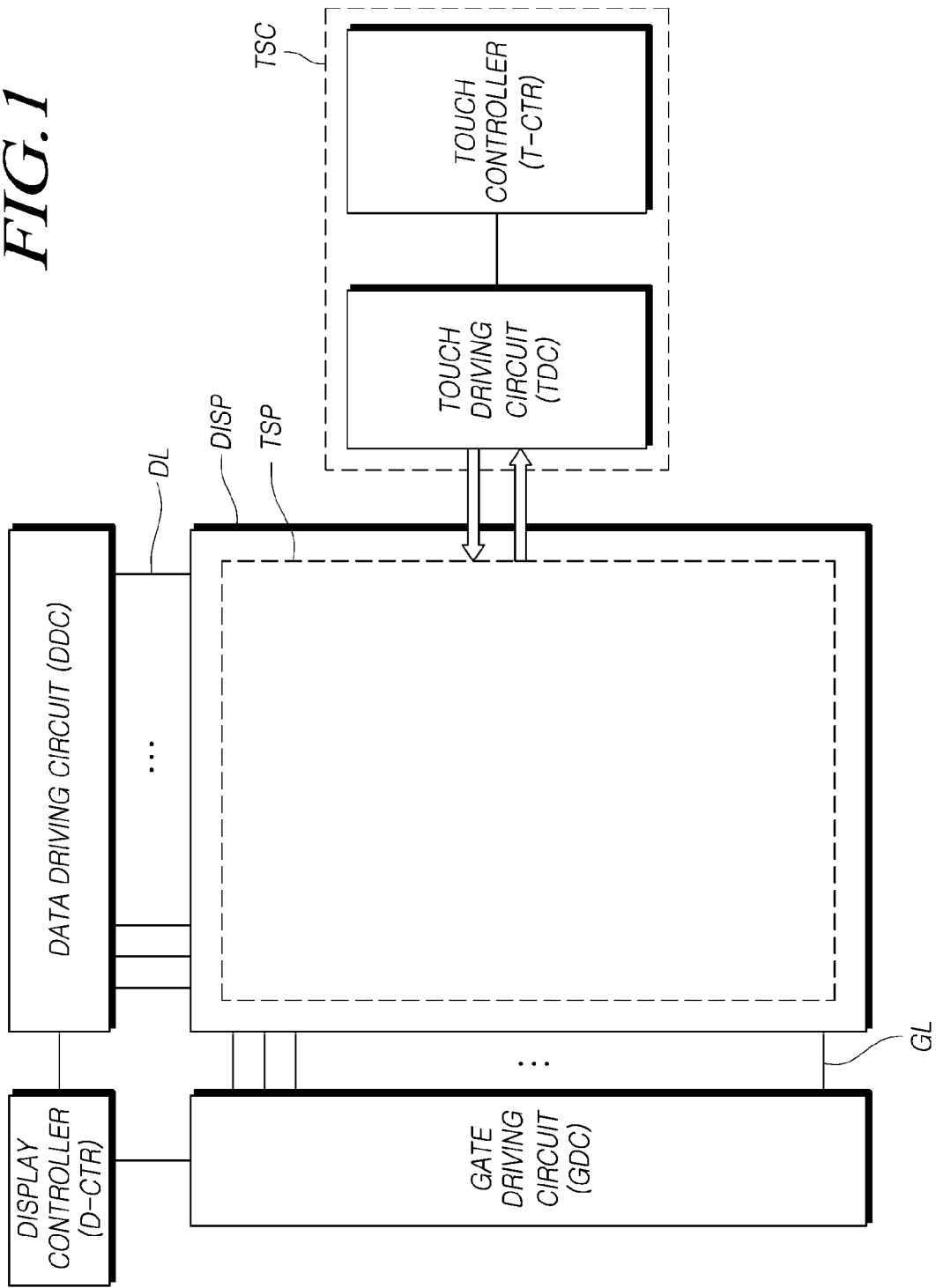
FIG. 1 is a schematic view illustrating a system configuration of a touch display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from other elements. The substance, sequence, order, or number of such elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly located on or under another element, but it can also be indirectly located on or under another element via an intervening element.

Figure 2:
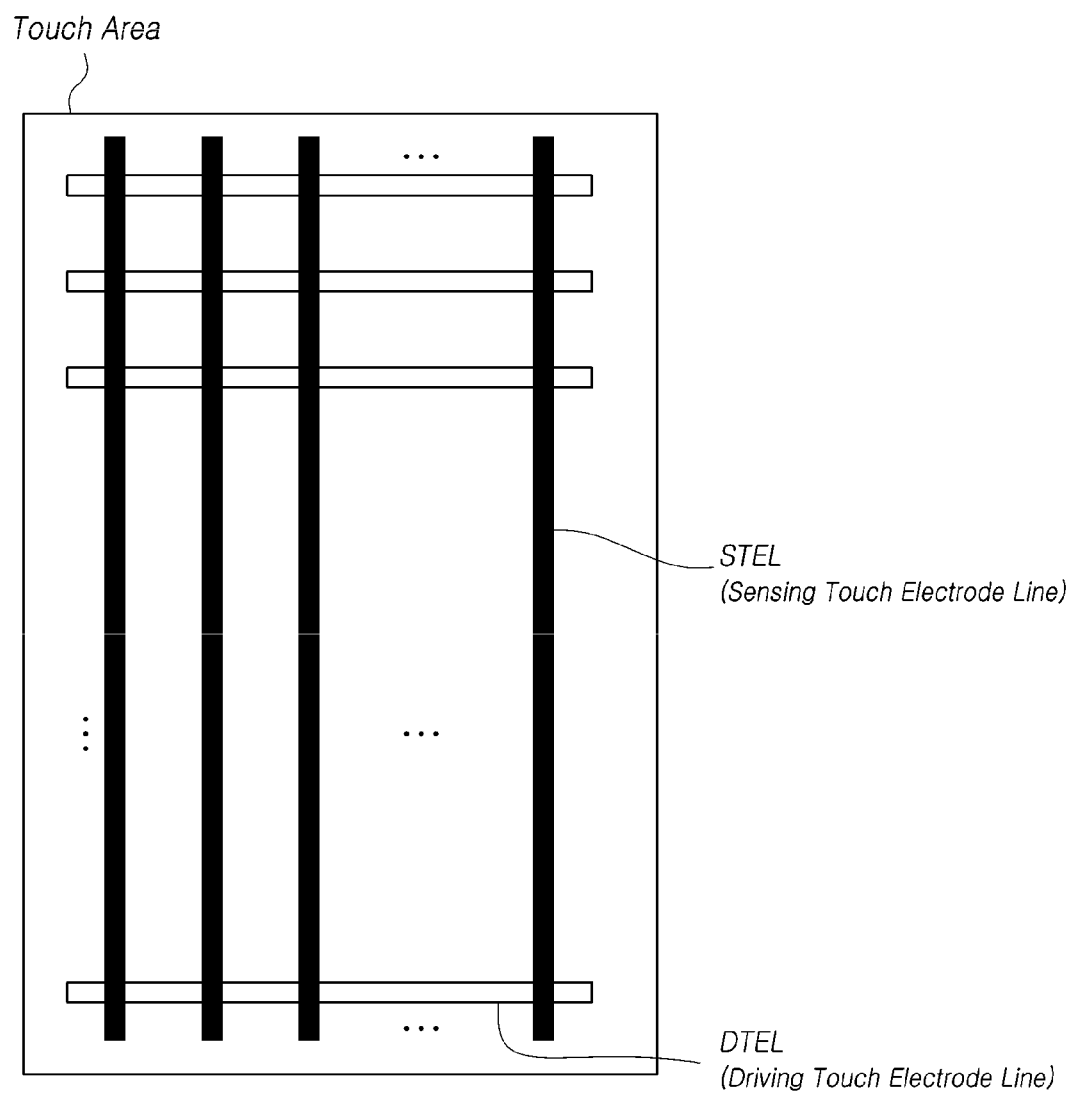
FIG. 2 is a schematic view illustrating a touch sensor structure in a touch area of a display panel according to exemplary embodiments.
Figure 3:
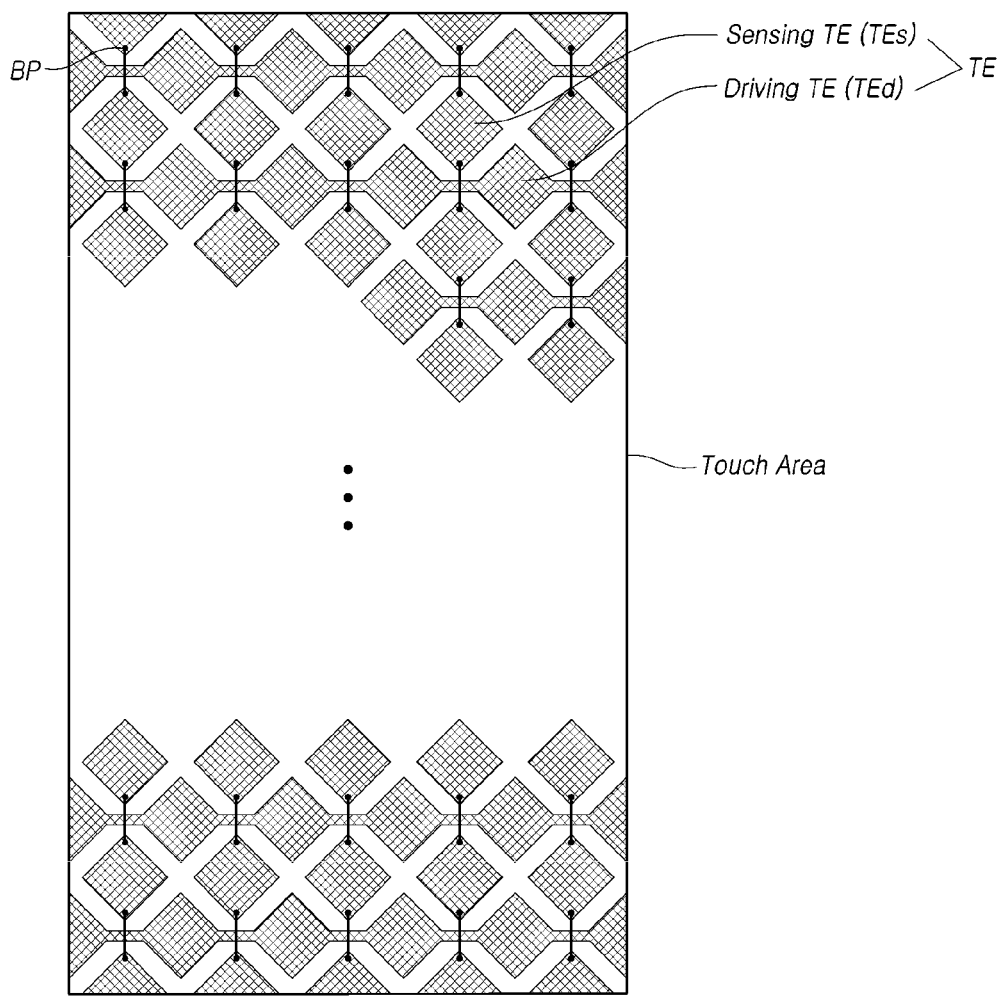
FIG. 3 illustrates an exemplary touch sensor structure in the touch area of the display panel according to exemplary embodiments.
Figure 4:
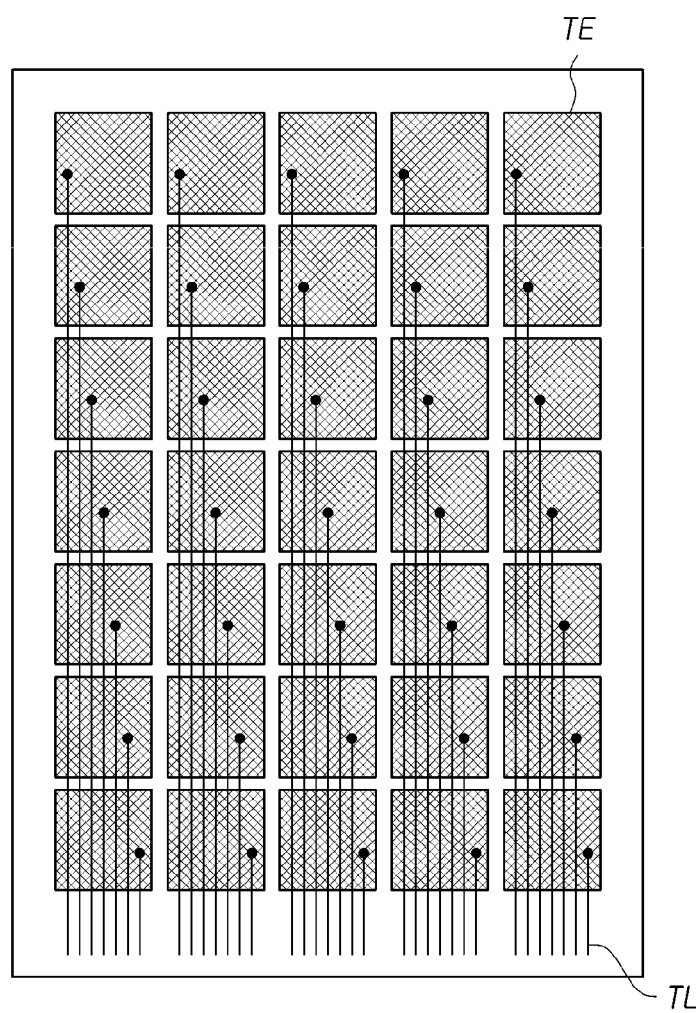
FIG. 4 illustrates an exemplary touchscreen panel in the case in the touch display device according to exemplary embodiments.
Figure 5:
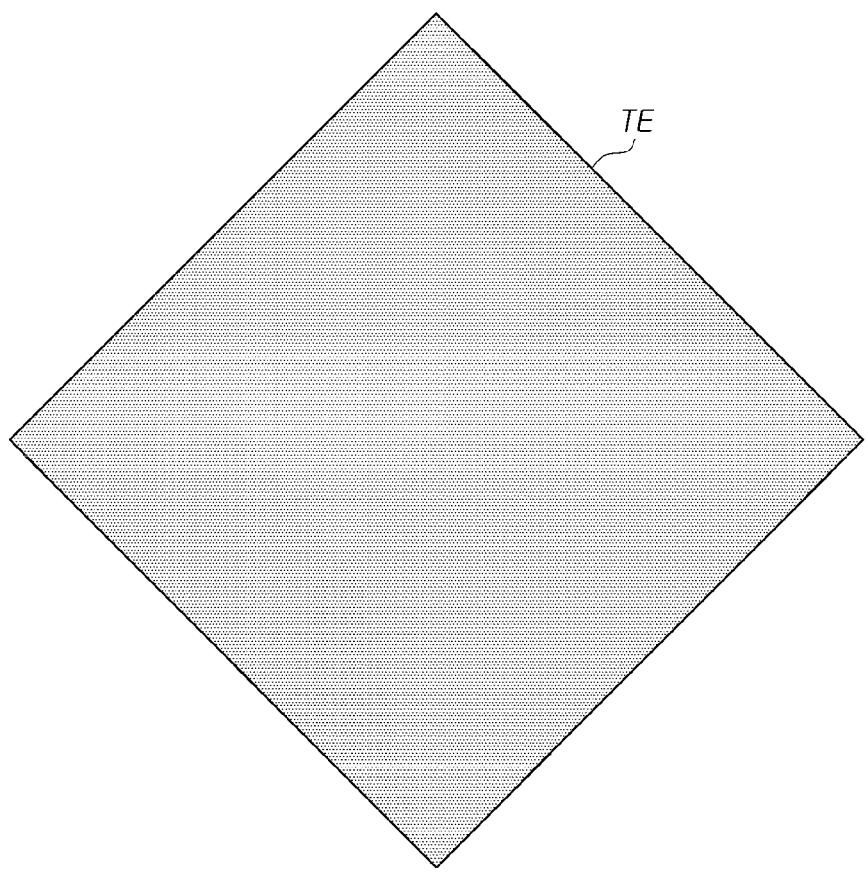
FIG. 5 illustrates a non-mesh-type touch electrode in the display panel according to exemplary embodiments.
Figure 6:
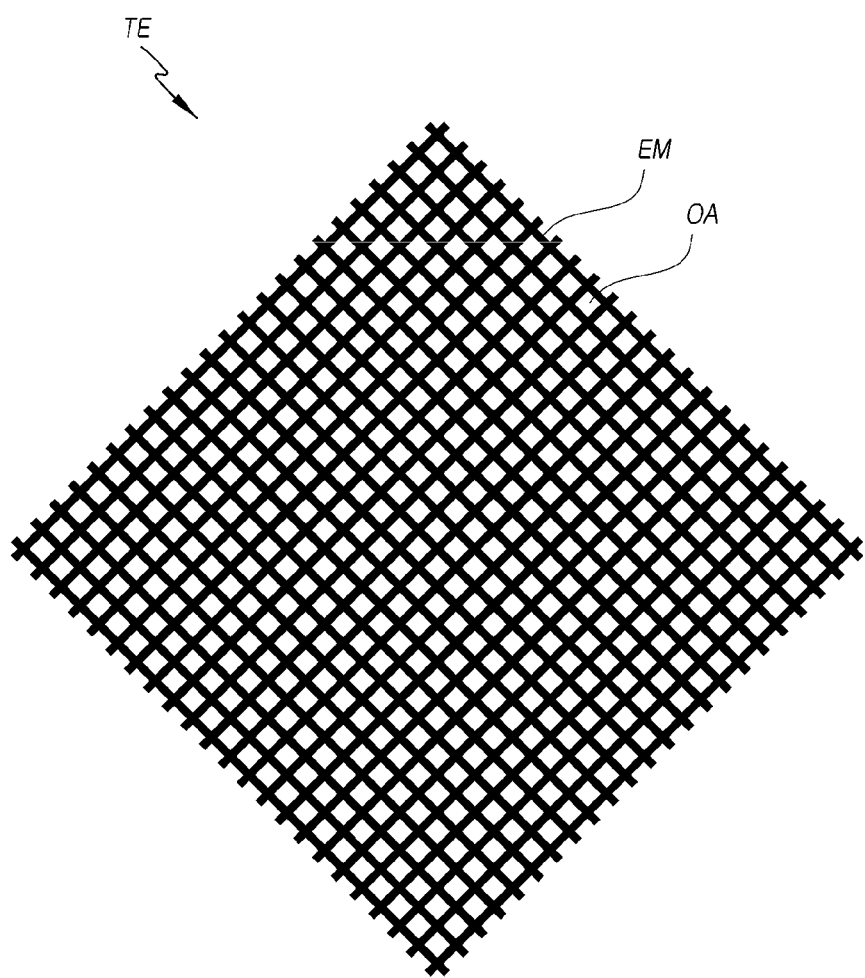
FIG. 6 illustrates a mesh-type touch electrode in the display panel according to exemplary embodiments.
Figure 7:
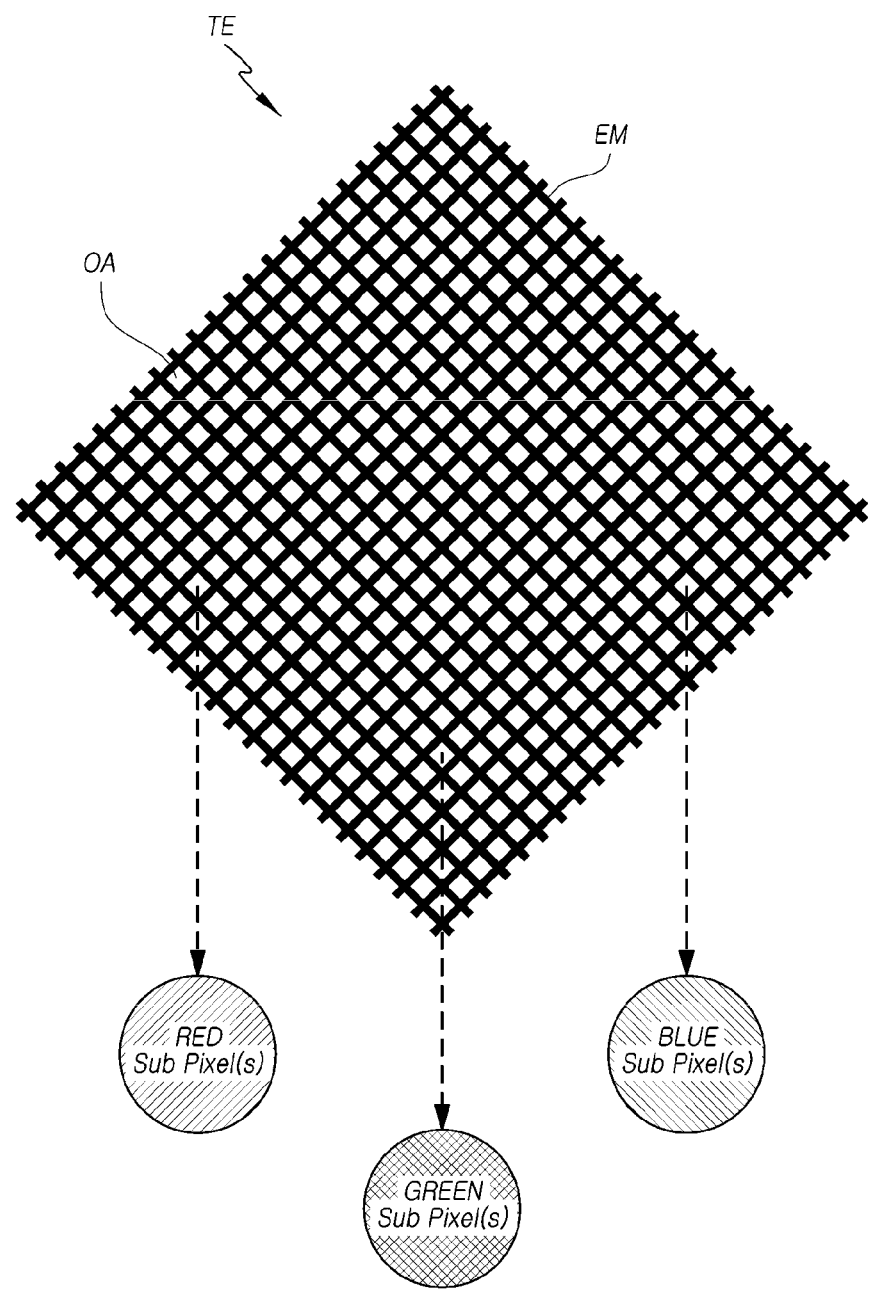
FIG. 7 illustrates the corresponding relationship between a mesh-type touch electrode and subpixels disposed in the touchscreen panel of the touch display device according to exemplary embodiments.
Figure 8:
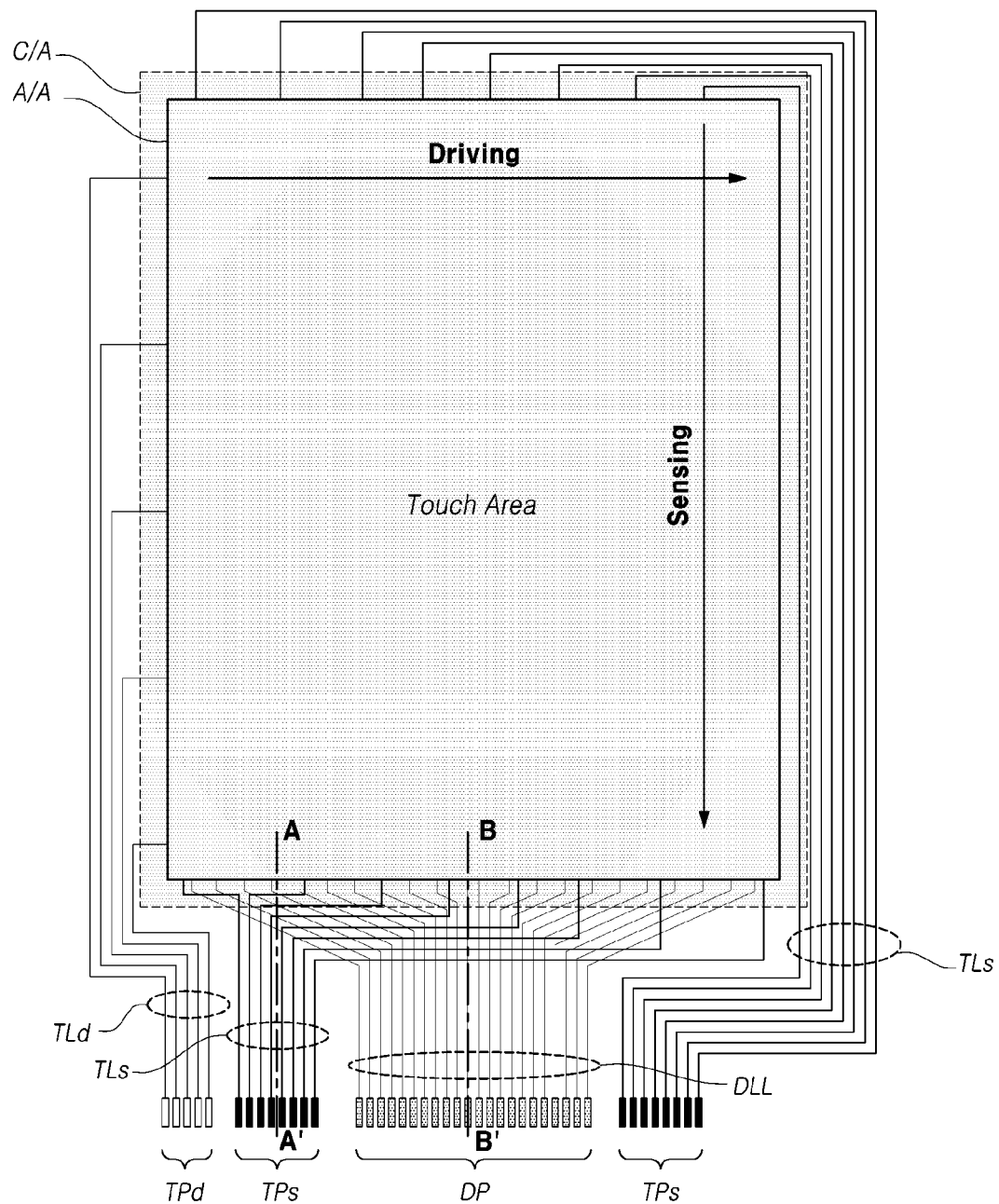
FIG. 8 illustrates an arrangement structure in which the driving touch lines, the sensing touch lines, and the data link lines are disposed in the non-active area, due to the touch sensor structure of the display panel according to exemplary embodiments.
Figure 9:
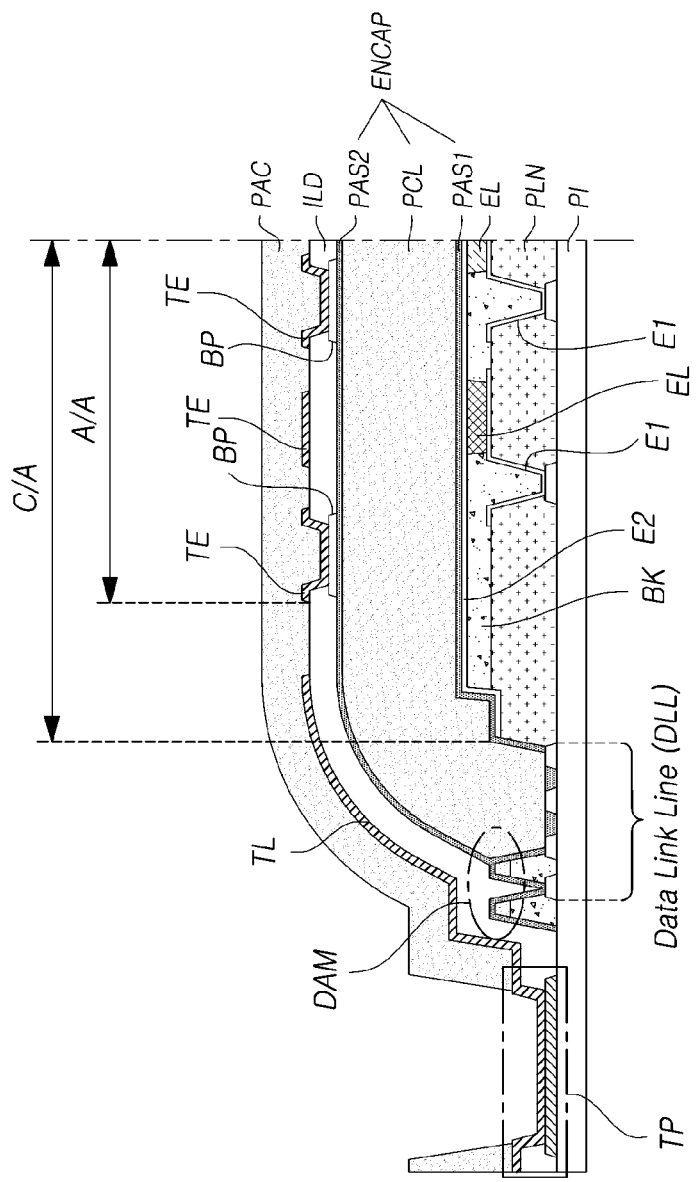
FIG. 9 is a cross-sectional view illustrating a portion of FIG. 8.
Figure 10:
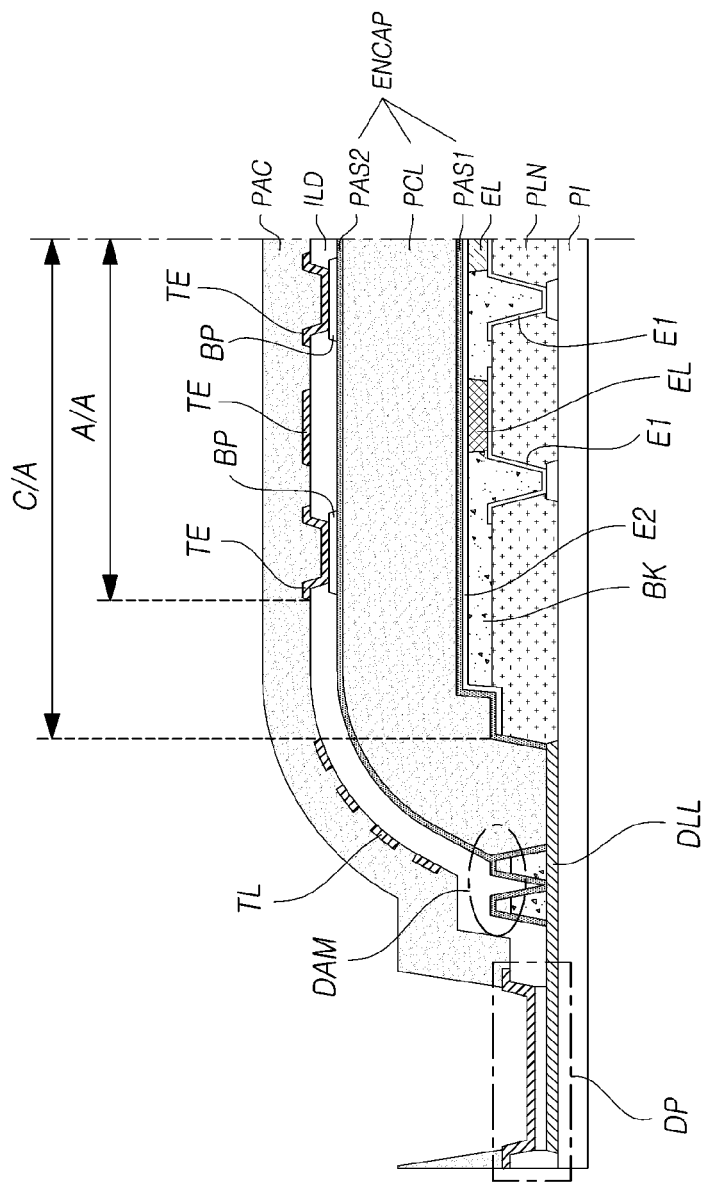
FIG. 10 is a cross-sectional view illustrating another portion of FIG. 8.
Figure 11:
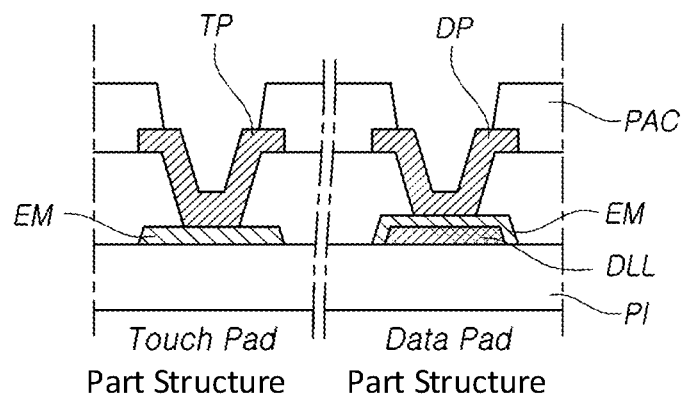
FIG. 11 is a cross-sectional view illustrating a data pad part structure and a touch pad part structure of the display panel according to exemplary embodiments.
Figure 12A:
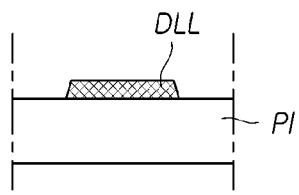
FIGS. 12A to 12I illustrate an exemplary process of depositing a metal layer of a same material as the touch sensor metals, the insulating film, and the like, on the data pad part of the display panel according to exemplary embodiments.

In the accompanying drawings, FIG. 1 is a schematic view illustrating a system configuration of a touch display device according to exemplary embodiments; FIG. 2 is a schematic view illustrating a touch sensor structure in a touch area of a display panel according to exemplary embodiments; FIG. 3 illustrates an exemplary touch sensor structure in the touch area of the display panel according to exemplary embodiments; FIG. 4 illustrates an exemplary touchscreen panel in the case in the touch display device according to exemplary embodiments; FIG. 5 illustrates a non-mesh-type touch electrode in the display panel according to exemplary embodiments; FIG. 6 illustrates a mesh-type touch electrode in the display panel according to exemplary embodiments; FIG. 7 illustrates the corresponding relationship between a mesh-type touch electrode and subpixels disposed in the touchscreen panel of the touch display device according to exemplary embodiments; FIG. 8 illustrates an arrangement structure in which the driving touch lines, the sensing touch lines, and the data link lines are disposed in the non-active area, due to the touch sensor structure of the display panel according to exemplary embodiments; FIG. 9 is a cross-sectional view illustrating a portion of FIG. 8; FIG. 10 is a cross-sectional view illustrating another portion of FIG. 8; FIG. 11 is a cross-sectional view illustrating a data pad part structure and a touch pad part structure of the display panel according to exemplary embodiments; FIGS. 12A to 12I illustrate an exemplary process of depositing the a metal layer of the same material as the touch sensor metals, the insulating film, and the like, on the data pad part of the display panel according to exemplary embodiments; and FIG. 13 is a flowchart illustrating the process of fabricating the display panel according to exemplary embodiments.

FIG. 1 is a schematic view illustrating a system configuration of a touch display device according to exemplary embodiments.

Referring to FIG. 1, the touch display device according to exemplary embodiments can provide an image display function to display images and a touch sensing function to sense a touch made by a user.

The touch display device according to exemplary embodiments includes a display panel DISP and a display driving circuit to display images. A plurality of data lines DL and a plurality of gate lines GL are disposed in the display panel DISP, such that a plurality of subpixels are defined thereby. The display driving circuit drives the plurality of data lines and the plurality of gate lines.

The display driving circuit may include a data driving circuit DDC to drive the data lines, a gate driving circuit GDC to drive the gate lines, a display controller D-CTR to control the data driving circuit DDC and the gate driving circuit GDC, and the like.

The touch display device according to exemplary embodiments may include a touchscreen panel TSP, a touch sensing circuit TSC, and the like to sense touches. A plurality of touch electrodes TE, acting as touch sensors, are disposed on the touchscreen panel TSP. The touch sensing circuit TSC serves to drive the touchscreen panel TSP and perform touch sensing processing.

The touch sensing circuit TSC supplies a driving signal to the touchscreen panel TSP to drive the touchscreen panel TSP, detects sensing signals from the touchscreen panel TSP, and based on the detected sensing signals, senses a touch and/or determines a touch position (or touch coordinates).

The touch sensing circuit TSC may include a touch driving circuit TDC supplying a driving signal and receiving sensing signals, a touch controller T-CTR calculating the occurrence of a touch and/or a touch position (or touch coordinates), and the like.

The touch sensing circuit TSC may be provided as including one or more components (e.g. integrated circuits (ICs)), or may be provided separately from the display driving circuit.

The entirety or a portion of the touch sensing circuit TSC may be integrated with the display driving circuit or one or more inner circuits of the display driving circuit. For example, the touch driving circuit TDC of the touch sensing circuit TSC, together with the data driving circuit DDC of the display driving circuit, may be provided as an IC.

The touch display device according to exemplary embodiments may sense a touch based on capacitance generated on the touch electrodes TE.

The touch display device according to exemplary embodiments may sense a touch using a capacitance-based touch sensing method, more particularly, by mutual-capacitance-based touch sensing or self-capacitance-based touch sensing.

FIGS. 2 to 4 illustrate three examples of touchscreen panel TSP in the touch display device according to exemplary embodiments. In FIGS. 2 to 4, FIGS. 2 and 3 illustrate an exemplary touchscreen panel TSP in the case in which the touch display device according to exemplary embodiments senses a touch by using mutual-capacitance, while FIG. 4 illustrates an exemplary touchscreen panel TSP in the case in which the touch display device according to exemplary embodiments senses a touch using self-capacitance.

Referring to FIGS. 2 and 3, in the case of mutual-capacitance-based touch sensing, a plurality of touch electrodes TE disposed on the touchscreen panel TSP may be categorized as driving touch electrodes (also referred to as driving electrodes, transmitting electrodes, or driving lines), to which a driving signal is applied, and sensing touch electrodes (also referred to as sensing electrodes, reception electrodes, or sensing electrodes), from which sensing signals are sensed and which generate capacitance together with the driving electrodes.

Referring to FIGS. 2 and 3, in the driving touch electrodes among the touch electrodes TE, the driving touch electrodes arranged in a single column (or a single row) are electrically connected to each other by an integration method (or a connection method using a bridge pattern), thereby providing a single driving touch electrode line DTEL.

Referring to FIGS. 2 and 3, in the sensing touch electrodes among the touch electrodes TE, the sensing touch electrodes arranged in a single row (or a single column) are electrically connected to each other using a bridge pattern (or by an integration method), thereby providing a single sensing touch electrode line STEL.

In mutual-capacitance-based touch sensing, the touch sensing circuit TSC applies a driving signal to one or more driving touch electrode lines DTEL, receives sensing signals from one or more sensing touch electrode lines STEL, and senses a touch and/or determines touch coordinates using the received sensing signals, based on a change in capacitance (i.e. mutual capacitance) between the driving touch electrode lines DTEL and the sensing touch electrode lines STEL depending on the presence or absence of a pointer, such as a finger or a pen (or stylus).

Referring to FIGS. 2 and 3, the plurality of driving touch electrode lines DTEL and the plurality of sensing touch electrode lines STEL are electrically connected to the touch driving circuit TDC via one or more touch lines TL in order to transfer a driving signal and sensing signals therethrough.

More specifically, each of the plurality of driving touch electrode lines DTEL is electrically connected to the touch driving circuit TDC via one or more driving touch lines TLd in order to transfer a driving signal. In addition, each of the sensing touch electrode lines STEL is electrically connected to the touch driving circuit TDC via one or more sensing touch lines TLs in order to transfer a sensing signal.

Referring to FIG. 4, in self-capacitance-based touch sensing, each of the touch electrodes TE disposed on the touchscreen panel TSP doubles as a driving touch electrode (to apply a driving signal) and a sensing touch electrode (to detect a sensing signal).

Specifically, a driving signal is applied to the touch electrodes TE, and sensing signals are received through the touch electrodes TE to which the driving signal is applied. Accordingly, in self-capacitance-based touch sensing, the driving electrodes may be indistinguishable from the sensing electrodes.

In such self-capacitance-based touch sensing, the touch sensing circuit TSC applies a driving signal to one or more touch electrodes TE, receives sensing signals from the touch electrodes TE to which the driving signal is applied, and senses a touch and/or determines touch coordinates using the received sensing signals, based on a change in capacitance between a pointer, such as a finger or a pen (or stylus), and the touch electrodes TE.

Referring to FIG. 4, each of the plurality of touch electrodes TE is electrically connected to the touch driving circuit TDC via one or more touch lines TL to transfer a driving signal and a sensing signal.

As described above, the touch display device according to exemplary embodiments can sense a touch based on mutual-capacitance-based touch sensing or self-capacitance-based touch sensing.

Hereinafter, for the sake of brevity, a case in which mutual-capacitance-based touch sensing is used in the touch display device and touchscreen panel TSP according to exemplary embodiments will be taken. However, self-capacitance-based touch sensing may also be applied to the touch display device and touchscreen panel TSP according to exemplary embodiments in the same manner.

In the touch display device according to exemplary embodiments, the touchscreen panel TSP may be an external type, in which the touchscreen panel TSP is fabricated separately from the display panel DSIP and is bonded to the display panel DSIP, or may be an internal type, in which the touchscreen panel TSP is fabricated simultaneously with fabrication of the display panel DSIP to be present within the display panel DSIP.

Hereinafter, for the sake of brevity, the touchscreen panel TSP will be illustrated as being an internal type present within the display panel DSIP. In this case, the touch electrodes TE and the touch lines TL are electrodes and signal lines located within the display panel DSIP.

In addition, the display panel DSIP of touch display device according to exemplary embodiments may be one of various types of display panels, such as an organic light-emitting diode (OLED) panel and a liquid crystal display (LCD) panel. Hereinafter, the display panel will mainly be described as being an OLED panel, for the sake of brevity.

FIG. 5 illustrates a non-mesh-type touch electrode TE disposed in the touchscreen panel TSP of the touch display device according to exemplary embodiments.

Referring to FIG. 5, in the touch display device according to exemplary embodiments, a plurality of touch electrodes TE disposed on the touchscreen panel TSP may be non-mesh-type touch electrodes.

Each of the non-mesh-type touch electrodes TE may be a plate-shaped electrode metal without an open area.

In this case, the touch electrode TE may be a transparent electrode.

FIG. 6 illustrates a mesh-type touch electrode disposed in the touchscreen panel of the touch display device according to exemplary embodiments.

Referring to FIG. 6, in the touch display device according to exemplary embodiments, the plurality of touch electrodes TE disposed on the touchscreen panel TSP may be mesh-type touch electrodes.

Each of the mesh-type touch electrodes TE may be provided as a touch sensor metal EM patterned into the shape of a mesh.

Accordingly, a plurality of open areas OA may be present in the area of the mesh-type touch electrode TE.

FIG. 7 illustrates the corresponding relationship between a mesh-type touch electrode TE and subpixels disposed in the touchscreen panel TSP of the touch display device according to exemplary embodiments.

Referring to FIG. 7, each of the plurality of open areas OA, present within the area of the touch electrode TE provided as the electrode metal EM patterned into the shape of a mesh, may correspond to emission areas of one or more subpixels.

In an example, each of the plurality of open areas OA lacking touch sensor metals and configured to pass light, present in the area of each touch electrode TE, may correspond to one or more emission areas of red, green, and blue subpixels.

In another example, each of the plurality of open areas OA, present within the area of each touch electrode TE, may correspond to one or more emission areas of red, green, blue, and white subpixels.

As described above, one or more emission areas of subpixels being present in each of the open areas OA of the touch electrode TE, when viewed on the plane, can further improve the degree of opening and luminous efficiency of the display panel DISP while enabling touch sensing.

As described above, the outline of each touch electrode TE may be approximately a rhombus, a rectangle (including a square), or the like. The open areas OA, corresponding to holes in the touch electrode TE, may have a shape of a rhombus, a rectangle (including a square), or the like.

However, the shape of the touch electrode TE, as well as the shape of the open areas OA, may be variously modified when designed, in consideration of the shape of the subpixels, the arrangement structure of the subpixels, touch sensitivity, and the like.

FIG. 8 illustrates an arrangement structure in which the driving touch lines, the sensing touch lines, and the data link lines are disposed in the non-active area, due to the touch sensor structure of the display panel according to exemplary embodiments.

Referring to FIGS. 2 and 8, each of the plurality of driving touch electrode lines DTEL is electrically connected to one or more driving touch lines TLd to drive the touchscreen panel TSP. In addition, each driving touch line TLd is electrically connected to the touch driving circuit TDC via a driving touch pad TPd.

For the sensing operation in the touchscreen panel TSP, each of the plurality of sensing touch electrode lines STEL is electrically connected to one or more sensing touch line TLs. In addition, each sensing touch line TLs is electrically connected to the touch driving circuit TDC via a sensing touch pad TPs.

In addition, the plurality of data lines DL (see FIG. 1) and the plurality of gate lines GL (see FIG. 1) are disposed in an active area A/A of the display panel DSIP.

The plurality of driving touch electrode lines DTEL and the plurality of sensing touch electrode lines STEL are disposed in the active area A/A of the display panel DSIP.

In a non-active area of the display panel DSIP, surrounding the active area A/A, a plurality of data link lines DLL are disposed to extend from or be connected to the plurality of data lines DL, a plurality of driving touch lines TLd are disposed to the connected to the plurality of driving touch electrode lines DTEL, and a plurality of sensing touch lines TLs are disposed connected to the plurality of sensing touch electrode lines STEL.

In the active area A/A corresponding to the touch area of the display panel DSIP, the plurality of driving touch electrode lines DTEL may be arranged in the same direction as the plurality of gate lines GL, and the plurality of sensing touch electrode lines STEL may be arranged in the same direction as the plurality of data lines DL.

In the non-active area of the display panel DSIP, surrounding the active area A/A, the plurality of data link lines DLL may extend from or be connected to the plurality of data lines DL, the plurality of driving touch lines TLd may be connected to the plurality of driving touch electrode lines DTEL, and the plurality of sensing touch lines TLs may be connected to the plurality of sensing touch electrode lines STEL.

In addition, a cathode area C/A may be the same as or greater than the active area A/A.

In the non-active area of the display panel DSIP, the entirety or a portion of the plurality of sensing touch lines TLs may overlap at least one of the plurality of data link lines DLL.

However, in this case, in the non-active area of the display panel DSIP, the plurality of driving touch lines TLd may not overlap the plurality of data link lines DLL.

FIG. 9 is a cross-sectional view illustrating a portion of FIG. 8, and FIG. 10 is a cross-sectional view illustrating another portion of FIG. 8.

First, FIG. 9 is a cross-sectional view taken along A-A' line in FIG. 8.

The cross-section in FIG. 9 represents an area in which a sensing touch electrode line STEL, a sensing touch line TLs connected to the sensing touch electrode line STEL, and a sensing touch pad TPs connected to the sensing touch line TLs are present. Touch electrodes and touch lines, located on an insulating film ILD, correspond to sensing touch electrodes TEs and sensing touch lines TLs, respectively, and touch pads, connected to the sensing touch lines TLs, correspond to sensing touch pads TPs. The cross-section in FIG. 9 represents an area of the display panel DSIP, including a touch pad part, and the symbols in FIG. 9 are designated with "TL," indicating the touch lines, and "TP," indicating the touch pads, without distinguishing between the sensing touch electrodes TEs and the driving touch electrodes TEd.

Referring to FIG. 9, a polyimide layer PI is provided on a substrate or a backplate.

The polyimide layer PI may be flexible.

The polyimide layer PI may be located on the substrate or may be present without the substrate.

Alternatively, the substrate may be present alone without the polyimide layer PI. The substrate may or not be flexible.

A source-drain layer may be present on the polyimide layer PI.

In the active area A/A, a variety of signal lines, such as data lines DL, a source/drain electrodes of a variety of transistors, and the like, may be fabricated on the source-drain layer.

In the non-active area, data link lines DLL, touch pads TP, and the like, may be fabricated on the source-drain layer.

A planarization film PLN may be provided on the source-drain layer.

First electrodes E1 are provided on the planarization film PLN to be located in emission positions of the subpixels, and banks BK are provided on the first electrodes E1. The first electrodes E1 may be referred to as pixel electrodes, since the first electrodes E1 are present in the subpixels, respectively.

An organic electroluminescent layer EL is provided on the first electrodes E1, between two adjacent banks BK.

A second electrode E2 may be provided on the organic electroluminescent layer EL. The second electrode E2 may be a common electrode provided in all of subpixel areas.

An encapsulating layer ENCAP may be present on the second electrode E2 to prevent penetration of moisture, air, or the like. The encapsulating layer ENCAP may extend to a peripheral area of the active area A/A and/or the cathode area C/A.

The encapsulating layer ENCAP may be provided as a monolayer or a multilayer comprised of two or more layers stacked on each other. In addition, the encapsulating layer ENCAP may be a metal layer or a multilayer comprised of two or more layers, including at least one organic layer and at least one inorganic layer, stacked on each other.

In the embodiment illustrated in FIG. 9, the encapsulating layer ENCAP is comprised of a first encapsulating layer PAS1, a second encapsulating layer PCL, and a third encapsulating layer PAS2. The first encapsulating layer PAS1 may be a first inorganic film, the second encapsulating layer PCL may be an organic film, and the third encapsulating layer PAS2 may be a second inorganic film.

A dam DAM is present on the periphery of the second encapsulating layer PCL. The dam DAM is provided by stacking the banks BK, the first encapsulating layer PAS1, and the third encapsulating layer PAS2 on each other.

The dam DAM can prevent the encapsulating layer ENCAP from collapsing outwardly of the panel.

Since the dam DAM includes an extension portion of the encapsulating layer ENCAP, the dam DAM can perform an encapsulating function, thereby protecting pixels or the like from moisture or the like that would otherwise penetrate into the panel through the sides.

An insulating film ILD is provided on the encapsulating layer ENCAP. The dam DAM may be at a boundary between the insulating film ILD and the second encapsulating layer PCL in the peripheral area of the active area A/A.

In the related art, a buffer layer T-BUF is provided on the encapsulating layer ENCAP. In contrast, in the embodiment illustrated in FIG. 9, the insulating film ILD is located on the encapsulating layer ENCAP. The insulating film ILD may be located on while being in contact with the top surface of the encapsulating layer ENCAP. Since the buffer layer T-BUF on the encapsulating layer ENCAP is removed, the fabrication process is simplified. The buffer layer T-BUF of the related art will be described in detail later.

The insulating film ILD extends to the peripheral area of the display panel DSIP.

Touch electrodes TE, as well as touch lines TL connecting the touch electrodes TE and the touch pads TP, are provided on the insulating film ILD.

The touch lines TL and the touch electrodes TE may be provided on the same layer or different layers.

The touch lines TL are connected to the touch electrodes TE, and extend to an area outside of the dam DAM in the non-active area, beyond the area in which the dam DAM is provided.

Portions of the touch lines TL, extending to the area outside of the dam, may act as the touch pads TP, and in some cases, may be in contact with the electrode pattern provided on the source-drain layer to act as the touch pads TP together with the electrode pattern.

The insulating film ILD may have contact-holes, through which the touch pads TP are exposed. Contact-holes of the insulating film ILD, through which the touch pads TP are exposed, may be defined as second contact-holes.

The electrode pattern, provided on the source-drain layer, may be comprised of touch sensor metals EM.

A metal layer of a same material as touch sensor metals EM may be fabricated simultaneously with fabrication of the touch electrodes TE and the touch lines TL.

The metal layer of the same material as touch sensor metals EM are connected to the touch pads TP via the above-described second contact-holes of the insulating film ILD.

Due to the metal layer of the same material as touch sensor metals EM being connected to the touch pads TP, the height of the touch pads TP, electrically connected to the touch driving circuit TDC, can be increased, such that the touch pads TP can be easily connected to the touch driving circuit TDC.

In addition, a protective film PAC is provided on the insulating film ILD.

The protective film PAC is located on the plurality of touch electrodes TE and the plurality of touch lines TL to protect the same.

The protective film PAC extends to the peripheral area of the display panel DSIP, along the insulating film ILD.

When the insulating film ILD has the second contact-holes, portions of the protective film PAC, in positions corresponding to the contact-holes, are etched, thereby exposing the touch pads TP.

The above-described touch electrodes TE have been illustrated as being the mesh-type touch electrodes, each of which has the open areas OA.

FIG. 10 is a cross-sectional view taken along B-B' line in FIG. 8.

The cross-section in FIG. 10 represents an area in which a data line DL, a data link line DDL connected to the data line DL, and a data pad DP connected to the data link line DLL are present. In the following description, some features will be omitted when they are the same as or similar to those described above with reference to FIG. 9.

The data lines DL, provided on the source-drain layer, extend to the peripheral area of the display panel DSIP. The data lines DL may extend to the peripheral area, or the data link lines DLL connected to the data lines DL may be present in the peripheral area.

The data pads DP are present in the peripheral area of the display panel DSIP to be connected to the data link line DLL.

The insulating film ILD, extending to the peripheral area of the display panel DSIP, may have contact-holes, through which the data link lines DLL are exposed to be connected to the data pads DP.

The contact-holes, provided in the insulating film ILD to expose the data link lines DLL, may be defined as first contact-holes.

A metal layer of a same material as the touch sensor metals EM may be provided between the data link lines DLL and the data pads DP.

The metal layer of the same material as the touch sensor metals EM may be provided on portions of the data link lines DLL while forming the touch electrodes TE and the touch lines TL.

The metal layer of the same material as the touch sensor metals EM are connected to the data pads DP via the first contact-holes of the insulating film ILD.

The metal layer of the same material as the touch sensor metals EM, provided on portions of the data link lines DLL, can protect the portions of the data link lines DLL from being damaged during fabrication of the touch electrodes TE, even in the case in which no buffer layer T-BUF is provided on the encapsulating layer ENCAP.

FIG. 11 is a cross-sectional view illustrating a data pad part structure and a touch pad part structure of the display panel according to exemplary embodiments.

Returning to the touch pads TP and the data pads DP illustrated in FIGS. 9 and 10, the metal layer of the same material as the touch sensor metals EM are present below the touch pads TP, and the touch pads TP and the metal layer of the same material as the touch sensor metals EM are connected via the second contact-holes in the insulating film ILD.

In addition, the metal layer of the same material as the touch sensor metals EM and the data link lines DLL are present below the data pads DP. The data pads DP, the metal layer of the same material as the touch sensor metals EM, and the data link lines DLL are connected via the first contact-holes of the insulating film ILD.

When both the touch pads TP and the data pads DP are considered, the height of the touch pads TP is similar to the height of the data pads DP, i.e. the touch pads TP and the data pads DP has substantially no height difference or a very small height difference. Accordingly, the pads can be easily connected to the data driving circuit DDC and the touch driving circuit TDC.

FIGS. 12A to 12I illustrate an exemplary process of depositing the metal layer of the same material as the touch sensor metals, the insulating film, and the like, on the data pad part of the display panel according to exemplary embodiments, and FIG. 13 is a flowchart illustrating the process of fabricating the display panel according to exemplary embodiments.

The process of fabricating the data pad part of the display panel will be described with reference to FIGS. 12A to 12I and FIG. 13. Since FIG. 13 illustrates the process of fabricating the display panel, and the data pad part is fabricated by the process illustrated in FIGS. 12A to 12I while the process of FIG. 13 is being undertaken, FIGS. 12A to 12I and FIG. 13 will be referred to at the same time.

First, the plurality of OLEDs, the plurality of data lines DL, and the plurality of gate lines GL are fabricated S1300 on the substrate PI. The data link lines DLL are fabricated in the peripheral area of the panel by extending the plurality of data lines DL to the peripheral area or forming components in the peripheral area to be connected to the plurality of data lines DL. At the same time, in the data pad part, the data link lines DLL are fabricated on the substrate PI, as illustrated in FIG. 12A.

Afterwards, the encapsulating layer ENCAP protecting the OLEDs is fabricated S1310.

First, after the inorganic banks BK are fabricated, the first encapsulating layer PAS1 is deposited using a mask by chemical vapor deposition (CVD).

Afterwards, the second encapsulating layer PCL, made of an organic material, is deposited s1310 on the first encapsulating layer PAS1.

Subsequently, the third encapsulating layer PAS2, made of an inorganic material, is deposited s1310 on the second encapsulating layer PCL using a mask by CVD.

In the fabrication of the encapsulating layer ENCAP, the banks BK, the first encapsulating layer PAS1, and the third PAS1 PAS2 are stacked on each other, thereby providing the dam DAM on the periphery of the second encapsulating layer PCL.

Afterwards, the touch sensor metals EM are deposited S1320 on the encapsulating layer ENCAP. The touch sensor metals EM, deposited s1320 on the encapsulating layer ENCAP, are bridge structures by which the lines of the sensing touch electrodes TEs of the touch electrodes TE can be disposed on a different layer from the lines of the driving touch electrodes TEd of the touch electrodes TE.

Figure 12B:
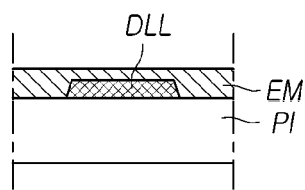
Figure 13:
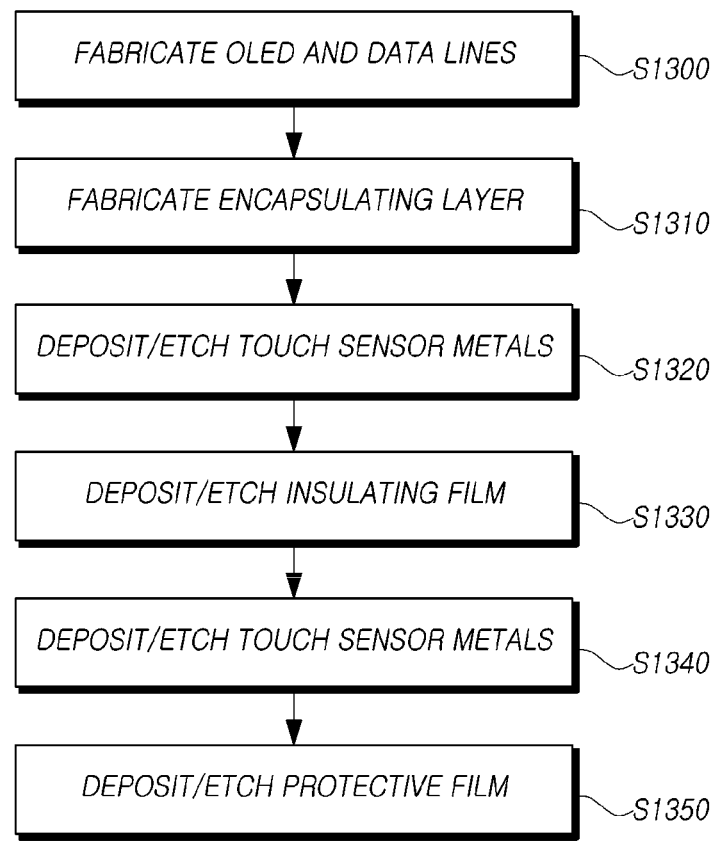
FIG. 13 is a flowchart illustrating the process of fabricating the display panel according to exemplary embodiments.

Here, in the data pad part in the periphery area of the panel, the metal layer of the same material as the touch sensor metals EM are deposited s1320 on portions of the data link lines DLL, as illustrated in FIG. 12B. The metal layer of the same material as the touch sensor metals EM may also be deposited 1320 on the touch pad part.

In this process, in the related art, a buffer layer T-BUF is deposited on the encapsulating layer ENCAP before deposition of the touch sensor metals EM in order to prevent the data link lines DLL in the peripheral area of the panel from being damaged in subsequent processes in which the insulating film ILD and the touch electrodes TE are fabricated s1330.

In contrast, as illustrated in FIG. 12B, when the metal layer of the same material as the touch sensor metals EM are deposited S1340 on the data link lines DLL to act as a protective layer of the data link lines DLL, it is possible to fabricate S1350 the protective layer of the data link lines DLL only by the subsequent deposition of the metal layer of the same material as the touch sensor metals EM while omitting the related-art process of depositing the buffer layer T-BUF.

Accordingly, it is possible to simplify the fabrication process while minimizing damage to the data link lines DLL caused by the fabrication process.

Figure 12C:
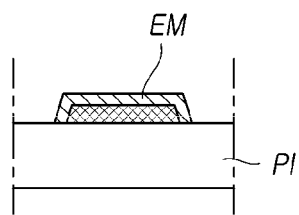

Subsequently, after the touch sensor metals EM are exposed by photoresist (PR) processing, the touch sensor metals EM are etched S1340, except for positions in which the bridges are to be fabricated, the positions of the data link lines DLL, and positions in which the touch pads are to be disposed. Here, dry etching can be applied. Consequently, the metal layer of the same material as the touch sensor metals EM are present on the data link lines DLL, as illustrated in FIG. 12C.

Figure 12D:
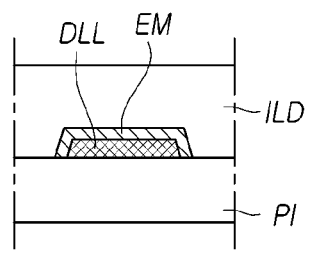

Afterwards, the insulating film ILD is deposited S1330 on the encapsulating layer ENCAP. In this case, in positions in which the touch sensor metals EM are not deposited, the insulating film ILD may be provided on the encapsulating layer ENCAP to be in contact with the encapsulating layer ENCAP. In the peripheral area of the panel, the insulating film ILD is provided s1330 on the metal layer of the same material as the touch sensor metals EM, as illustrated in FIG. 12D.

Figure 12E:
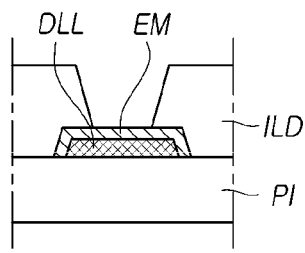

Subsequently, after the insulating film ILD is exposed by PR processing, positions in which the touch sensor metals EM are provided are etched s1340. In this case, contact-holes, through which the touch sensor metals EM, deposited on the encapsulating layer ENCAP, are connected to the touch electrodes TE by bridges, are provided in the insulating film ILD. The metal layer of the same material as the touch sensor metals EM on the data link lines DLL are exposed through first contact-holes, while the metal layer of the same material as the touch sensor metals EM and the touch pads of the touch pad part are connected via second contact-holes. Here, dry etching can be used. This consequently forms the first contact-holes, through which the metal layer of the same material as the touch sensor metals EM on the data link lines DLL are exposed, as illustrated in FIG. 12E.

Afterwards, the touch sensor metals EM are deposited s1340 on the insulating film ILD. The touch sensor metals EM, deposited s1340 on the insulating film ILD, form the sensing touch electrodes TEs or the driving touch electrodes TEd, the sensing touch lines TLs, and the driving touch lines TLd.

Figure 12F:
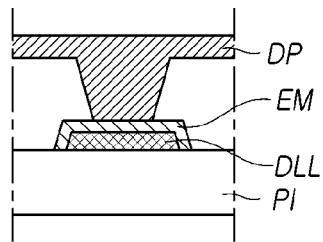

As illustrated in FIG. 12F, the metal layer of the same material as the touch sensor metals EM are deposited s1330 on the insulating film ILD, in the peripheral area of the panel. The metal layer of the same material as the touch sensor metals EM, deposited in FIG. 12F, are the data pads DP.

Figure 12G:
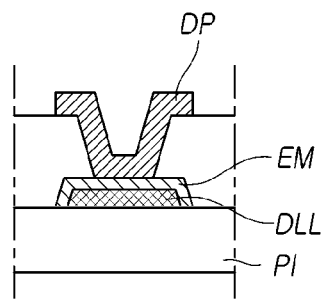

Subsequently, after the touch sensor metals EM are exposed by PR processing, the touch sensor metals EM are etched, except for positions in which the sensing touch electrodes TEs or the driving touch electrodes TEd, the sensing touch lines TLs, and the driving touch lines TLd are to be fabricated. Here, dry etching may be used. Consequently, as illustrated in FIG. 12G, the data pads DP, the metal layer of the same material as the touch sensor metals EM, and the data link lines DLL are connected via the first contact-holes.

Figure 12H:
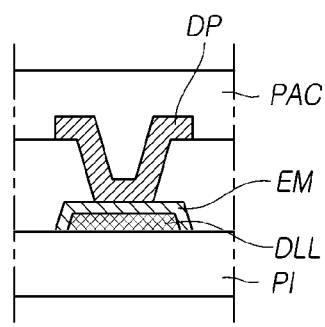
Figure 12I:
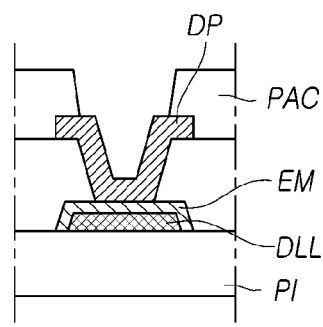

Afterwards, the protective film PAC is deposited s1350 on the insulating film ILD, and positions of the first contact-holes and the second contact-holes are exposed and etched s1350, such that the data pads DP and the touch pads TP are exposed. Consequently, as illustrated in FIGS. 12H and 12I, a structure in which the data pads DP and the touch pads TP are connected to the data driving circuit DDC and the touch driving circuit TDC, respectively, is fabricated.

As set forth above, according to exemplary embodiments, the touch display device and panel can be easily fabricated, due to the simplified fabrication process of the touch display panel.

According to exemplary embodiments, the overall panel thickness of the touch display device and panel can be reduced.

According to exemplary embodiments, in the touch display device and panel, the touch sensor metals can be used in the data pad part and the touch pad part to protect the data link lines while reducing the difference in height between the data pad part and the touch pad part.

Although all of the components constituting exemplary embodiments have been described as being combined together or as operating in concert with each other, the present disclosure is not necessarily limited thereto. Rather, one or more components may be selected from the entire components to be combined together and operate in a combined form within the scope of the present disclosure.

It will be understood that the terms "comprise," "include," "have," and any variations thereof used herein are intended to cover non-exclusive inclusions unless explicitly described to the contrary. Unless otherwise defined, all terms including technical and scientific terms used herein have the same meaning as commonly understood by a person skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing embodiments disclosed herein shall be interpreted as illustrative only but not as limitative of the principle and scope of the present disclosure. It should be understood that the scope of the present disclosure shall be defined by the appended Claims and all of their equivalents fall within the scope of the present disclosure.

What is claimed is:

1. A touch display device comprising:
   a display panel in which a plurality of data lines, a plurality of gate lines, a plurality of subpixels defined by the plurality of data lines and the plurality of gate lines, a plurality of touch electrodes, and a plurality of touch lines connected to the plurality of touch electrodes are disposed;
   a display driving circuit driving the plurality of data lines and the plurality of gate lines; and
   a touch driving circuit driving the plurality of touch lines, wherein the plurality of touch electrodes and the plurality of touch lines comprise touch sensor metals, and
   wherein the display panel comprises:
   an encapsulating layer protecting an organic light-emitting diode at each of the plurality of subpixels, the encapsulating layer extending to a peripheral area of the display panel;

an insulating film at least a part of which is provided on the encapsulating layer and extends to the peripheral area of the display panel;

a plurality of data link lines connected to the plurality of data lines in the display panel, the plurality of data link lines extending to the peripheral area of the display panel;

data pads connected to the plurality of data link lines exposed through first contact-holes of the insulating film, the data pads connected to the display driving circuit; and touch pads connected to an electrode pattern of the plurality of touch electrodes in the display panel, the touch pads connected to the plurality of touch lines located on the insulating film in the peripheral area of the display panel.

2. The touch display device according to claim 1, further comprising a metal layer of a same material as touch sensor metals disposed between the plurality of data link lines and the data pads.

3. The touch display device according to claim 2, wherein the metal layer, the plurality of data link lines, and the data pads are connected via the first contact-holes of the insulating film.

4. The touch display device according to claim 1, further comprising a metal layer of a same material as touch sensor metals disposed under and connected to the touch pads via second contact-holes of the insulating film.

5. The touch display device according to claim 1, wherein the encapsulating layer comprises a first encapsulating layer, a second encapsulating layer, and a third encapsulating layer, and a dam comprising a bank, the first encapsulating layer, and the third encapsulating layer, stacked on each other, is provided at a boundary between the insulating film and the second encapsulating layer in the peripheral area of the display panel.

6. The touch display device according to claim 5, wherein each of the first encapsulating layer and the third encapsulating layer comprises an inorganic material, and the second encapsulating layer is made of an organic material.

7. The touch display device according to claim 1, wherein each of the plurality of touch electrodes is patterned into a shape of a mesh.

8. The touch display device according to claim 7, wherein a plurality of open areas lacking touch sensor metals and configured to pass light are present in each area of the plurality of touch electrodes.

9. The touch display device according to claim 8, wherein each of the plurality of open areas corresponds to an emission area of at least one subpixel of the plurality of subpixels.

10. The touch display device according to claim 1, further comprising a protective film provided on the insulating film to protect the plurality of touch electrodes and the plurality of touch lines.

11. The touch display device according to claim 10, wherein the protective film extends to the peripheral area of the display panel along a surface of the insulating film.

12. The touch display device according to claim 1, wherein the insulating film is located on and in contact with a top surface of the encapsulating layer.

13. A touch display panel comprising:
a plurality of organic light-emitting diodes at a plurality of subpixels defined by a plurality of data lines and a plurality of gate lines;

an encapsulating layer protecting the plurality of organic light-emitting diodes;

an insulating film at least a part of which is located on and in contact with the encapsulating layer;

a plurality of data link lines connected to the plurality of data lines in the touch display panel, the plurality of data link lines extending to a peripheral area of the encapsulating layer;

data pads connected to the plurality of data link lines exposed through first contact-holes of the insulating film, the data pads connected to a display driving circuit; and touch pads connected to an electrode pattern of touch electrodes in the touch display panel, the touch pads connected to the plurality of touch lines located on the insulating film in the peripheral area of the encapsulating layer.

14. The touch display panel according to claim 13, further comprising a metal layer of a same material as touch sensor metals disposed between the plurality of data link lines and the data pads.

15. The touch display panel according to claim 14, wherein the metal layer, the plurality of data link lines, and the data pads are connected via the first contact-holes of the insulating film.

16. The touch display panel according to claim 13, further comprising a metal layer of a same material as touch sensor metals disposed under and connected to the touch pads via second contact-holes of the insulating film.

17. A touch display panel comprising:
a plurality of organic light-emitting diodes at a plurality of subpixels defined by a plurality of data lines and a plurality of gate lines;

an encapsulating layer protecting the plurality of organic light-emitting diodes, the encapsulating layer extending to a peripheral area of an active area of the touch display panel;

an insulating film located on and in contact with the encapsulating layer, wherein the insulating film extends to a data pad area in the peripheral area of the active area of the touch display panel, wherein the data pad area comprises a metal layer of a same material as touch sensor metals of touch electrodes of the touch display panel, the metal layer disposed between a plurality of data link lines and data pads.

18. The touch display panel according to claim 17, wherein the data pads are connected to the plurality of data link lines exposed through first contact-holes of the insulating film.

19. The touch display panel according to claim 17, wherein the metal layer, the plurality of data link lines, and the data pads are connected via first contact-holes of the insulating film.

20. A touch display device comprising:
a display panel in which a plurality of data lines, a plurality of gate lines, a plurality of subpixels defined by the plurality of data lines and the plurality of gate lines, a plurality of touch electrodes comprising touch sensor metals, and a plurality of touch lines comprising touch sensor metals connected to the plurality of touch electrodes are disposed; and a plurality of data link lines connected to the plurality of data lines in the display panel, the plurality of data link lines extending to a peripheral area of an active area of the display panel, wherein a metal layer of a same material as touch sensor metals is disposed on the plurality of data link lines.

21. The touch display device according to claim 20 further comprising:
   an encapsulating layer protecting an organic light-emitting diode in each of the plurality of subpixels, the encapsulating layer extending to the peripheral area of the active area the display panel; and
   an insulating film at least a part of which is provided on the encapsulating layer and extends to the peripheral area of the active area of the display panel.

22. The touch display device according to claim 21 further comprising:
   data pads connected to the plurality of data link lines exposed through first contact-holes of an insulating film, wherein a metal layer of a same material as touch sensor metals is disposed between the plurality of data link lines and the data pads.

* * * * *